United States Patent
Kobayashi

(10) Patent No.: US 7,020,452 B1
(45) Date of Patent: Mar. 28, 2006

(54) ACTIVELY MATCHED CENTER-TAPPED MARCHAND BALANCED MIXER

(75) Inventor: Kevin W. Kobayashi, Torrance, CA (US)

(73) Assignee: Sirenza Microdevices, Inc., Broomfield, CO (US)

( * ) Notice: Subject to any disclaimer, the term of this patent is extended or adjusted under 35 U.S.C. 154(b) by 57 days.

(21) Appl. No.: 10/425,335

(22) Filed: Apr. 29, 2003

(51) Int. Cl.
*H04B 1/25* (2006.01)

(52) U.S. Cl. ............... 455/326; 455/330; 455/333; 327/113

(58) Field of Classification Search ........... 455/326, 455/330–333, 327–328, 318–325, 331, 302–306, 455/118–119, 313–317; 327/113, 355–356, 327/361, 119–120, 357, 359
See application file for complete search history.

(56) References Cited

U.S. PATENT DOCUMENTS

| | | | | |
|---|---|---|---|---|
| 3,693,106 A * | 9/1972 | Long et al. | .................. | 330/265 |
| 4,816,784 A | 3/1989 | Rabjohn | .................. | 333/24 R |
| 5,003,622 A * | 3/1991 | Ma et al. | .................. | 455/327 |
| 5,060,298 A * | 10/1991 | Waugh et al. | .................. | 455/326 |
| 5,157,786 A * | 10/1992 | Muterspaugh | .................. | 455/326 |
| 5,280,648 A * | 1/1994 | Dobrovolny | .................. | 455/326 |
| 5,381,084 A * | 1/1995 | Joshi et al. | .................. | 323/361 |
| 5,434,546 A * | 7/1995 | Palmer | .................. | 332/151 |
| 5,678,225 A * | 10/1997 | Kobayashi | .................. | 455/330 |
| 5,742,897 A * | 4/1998 | Plowdrey et al. | .................. | 455/142 |
| 6,026,286 A | 2/2000 | Long | .................. | 455/327 |
| 6,351,632 B1 * | 2/2002 | Yan et al. | .................. | 455/333 |
| 6,810,241 B1 * | 10/2004 | Salib | .................. | 455/326 |
| 6,871,059 B1 * | 3/2005 | Piro et al. | .................. | 455/333 |
| 2001/0036818 A1 | 11/2001 | Dobrovolny | .................. | 455/326 |
| 2002/0094796 A1 | 7/2002 | Woods et al. | .................. | 455/260 |
| 2003/0171109 A1 | 9/2003 | Ballweber et al. | .................. | 455/323 |
| 2003/0199259 A1 | 10/2003 | Macedo et al. | .................. | 455/141 |

OTHER PUBLICATIONS

S. Basu and S.A. Maas, "Design and Performance of a Planar Star Mixer", IEEE Transactions on Microwave Theory and Techniques, vol. 41, No. 11, Nov. 1993, pp. 2028-2030.

R.H. Jansen et al., "Improved Compaction of Multilayer MMIC/MCM Baluns Using Lumped Element Compensation", IEEE, Jun. 1997, 4 pages.

Yeong J. Yoon et al., "Design and Characterization of Multilayer Spiral Transmission-Line Baluns", IEEE Transactions on Microwave Theory and Techniques, vol. 47, No. 9, Sep. 1999, pp. 1841-1847.

Mitsuhiro Shimozawa et al., "A Parallel Connected Marchand Balun Using Spiral Shaped Equal Length Coupled Lines", 1999 IEEE, pp. 1737-1740.

Stephen Maas, "A Broadband Planar Monolithic Ring Mixer", IEEE 1996 Microwave and Millimeter-Wave Monolithic Circuits Symposium, pp. 51-54.

(Continued)

*Primary Examiner*—Pablo N. Tran
(74) *Attorney, Agent, or Firm*—Christopher P. Maiorana, PC

(57) ABSTRACT

An apparatus comprising an amplifier circuit, a tuning circuit and a mixer circuit. The amplifier circuit may be configured to generate an output signal at a first node in response to an input signal received through a second node. A tuning circuit may be (i) coupled between said second node of the amplifier circuit and third node and (ii) configured to adjust an impedance presented to the third node in response to a tuning voltage. A mixer circuit may have a center tap coupled to the third node.

20 Claims, 16 Drawing Sheets

OTHER PUBLICATIONS

Y.I. Ryu et al., "A Monolithic Broadband Doubly Balanced EHF HBT Star Mixer With Novel Microstrip Baluns", IEEE 1995 Microwave and Millimeter-Wave Monolithic Circuits Symposium, pp. 155-158.

S.A. Maas et al., "A Broadband, Planar, Doubly Balanced Monolithic Ka-Band Diode Mixer", IEEE 1993 Microwave and Millimeter-Wave Monolithic Circuits Symposium, pp. 53-55.

* cited by examiner

PIN (dBm) = | -30

(INPUT PARAMETERS)
SIGNAL PATH ELEMENTS

| DEVICE | GAIN (dB) | NF (dB) | IP3 (dBm) |
|---|---|---|---|
| MIXER | -8.00 | 8.00 | 22.00 |
| IF AMP | 20.00 | 3.50 | 30.00 |

| ACC GAIN (dB) | ACC NF (dB) | SIG PWR (dB) | IM3 (dBc) | ACC IP3 (dBm) |
|---|---|---|---|---|
| -8.00 | 8.00 | -38.00 | 120.00 | 22.00 |
| 12.00 | 11.50 | -18.00 | 95.47 | 29.73 |

ACCUMULATED TOTALS

| 12.00 | 11.50 | -18.00 | 95.47 | 29.73 |

IIP3 = | 17.73

ACTIVELY MATCHED CENTER-TAPPED MARCHAND BALANCED MIXER

FIELD OF THE INVENTION

The present invention relates to mixers generally and, more particularly, to a method and/or architecture for implementing an actively matched center-tapped Marchand balanced mixer.

BACKGROUND OF THE INVENTION

U.S. Pat. No. 4,816,784 to Rabjohn discloses a conventional cross over layout. Such a layout generally comprises coupling between adjacent windings (as shown in FIG. 3a and discussed on col. 4, line 55 of the issued patent). In addition, the crossovers by themselves constitute a parasitic which may degrade coupling performance.

Col. 7, line 22 of Rabjohn describes an asymmetry problem. A solution discussed by Rabjohn (starting on col. 7, line 31) involves floating or opening the conventionally grounded terminal of the primary winding. Rabjohn grounds the center tap of the primary winding to induce a symmetrically identical signal to the parasitic capacitor 40 as was originally applied to the parasitic capacitor 38 in FIGS. 6/7 of Rabjohn. By grounding the center tap of the primary winding, broadband Marchand operation is fundamentally non-existent. Furthermore, Rabjohn intentionally grounds the center tap of the secondary winding, eliminating the provision of an intermediate frequency (IF) center tap. In the ideal Marchand balun, the center tap port would physically be grounded disallowing the use of an IF center tap.

Multi-decade microwave mixers are needed for broadband communication systems. Such mixers range from a few MHz up to microwave frequencies at 20 Ghz or more. Inexpensive passive monolithically integrated microwave circuit (MMIC) Schottky mixers are attractive for their low parasitics and resulting wide frequency bandwidth, good intermodulation performance, and low cost. Some of the best conventional radio frequency (RF) MMIC mixer performance has been obtained from planar Marchand balanced mixers. However, such mixers are prohibitively large, requiring lambda/4 passive geometries.

Conventional active MMIC mixers can obtain multi-decade bandwidths, low power and high gain. However, such mixers consume significant DC power and cannot match the RF linearity of passive MMIC mixers. Wide band MMIC RF mixers have been implemented, but lack bandwidth, do not provide a small size/low cost, and/or have poor RF linearity.

MMIC Planar transformer Schottky mixers achieve excellent linearity using a reasonably size, but typically have sub-octave bandwidths. Active MMIC mixers, such as the Gilbert multiplier, achieve wide multi-decade bandwidth in a compact area. However, such implementations cannot match the RF linearity of passive mixer approaches.

MMIC lumped element passive Schottky mixers can achieve good RF linearity but are usually not as compact as the planar transformer approach. However, such mixers are also limited to about an octave in bandwidth. Marchand MMIC balanced Schottky mixers achieve some of the widest bandwidths and good Schottky linearity performance. However, they typically are large and do not offer a straightforward way of providing an IF center tap due to their inherent physical structure.

Referring to FIG. 1, a circuit 10 illustrating conventional transformer balun representation is shown. The transformer balun 10 is typically implemented as interwound planar microstrip transmission lines on a substrate. 1:1 transformer ratios are used to provide an even power split to the complementary outputs. Typical use of the transformer in mixers uses the primary coil as the single-ended input with one terminal receiving the signal and the other terminal being grounded. A secondary coil provides complementary (i.e., 0 and 180 degree) outputs. A center tap can be taken from the middle of the secondary coil. The center tap combines signals introduced from the complementary ports in a destructive manner to provide inherent isolation from the input and complementary ports.

Referring to FIG. 2, a circuit 20 illustrating a conventional MMIC implementation of a planar transformer balun on a GaAs Substrate is shown. The planar center tapped balun consists of a pair of interwound planar microstrip transmission lines. Suggested dimensions of the coil is given for a 100 um thick Gallium Arsenide (GaAs) implementation for microwave operation of 3–9 GHz for a grounded balun, and 4–20 GHz for an open balun. The primary coil has a single-ended input where the other side is either grounded (conventional case) or open (Marchand applications). The secondary coil provides the complementary output and center tap. In conventional use, one end of the primary coil is grounded.

Referring to FIG. 3, a conventional center tap transformer 30 is shown. With 50 ohms at the input and output ports, the balun transformer response for the practical planar transformer 30 will be dependent on the impedance at the center tap port. One characteristic found in the planar transformer balun is that transmission line characteristics are dependent on port impedances. More particularly, the planar transformer balun has a tendency to have better complementary matched outputs when the center tap impedance is zero. For the local oscillator (LO) port of a mixer, the center tap is normally grounded, providing excellent balanced performance and LO isolation at the center-tap. For the RF port where the center tap is used as the IF port, the center tap is not typically grounded. Such an RF port is typically matched to a 50 ohm IF amplifier load, making the RF transformer operation less ideal over a broad frequency range.

Referring to FIG. 4, electromagnetic (EM) simulations of "Short" planar transformer amplitude and phase balance is shown. Amplitude and phase balance become worse as Ztap becomes larger. FIG. 4 shows the EM simulation of a planar balun transformer (similar to the construction of FIG. 2) for two different IF center tap impedances (i.e., Ztap=10 ohms and Ztap=50 ohms). Comparing the amplitude and complementary phase balance for the two cases, the amplitude and phase balance (180 degrees) between the complementary outputs of the balun are better matched over the 2–8 GHz frequency range for the 10 ohm Ztap impedance case. The amplitude balance of FIG. 4a rolls off slower than that of FIG. 4c of the 50 ohm case. Also the complementary phase balance of FIG. 4b is flatter across the frequency band than that of FIG. 4d of the 50 ohm case. The need for lower impedance becomes even more dramatic for open balun transformer implementations.

Referring to FIG. 5, a circuit 50 illustrating a conventional planar transformer open configuration is shown. By opening the grounded port of the planar transformer, a wider band high pass Marchand balun can be created due to the transmission-line properties of the traces making up the coils. In essence, this configuration resembles a Marchand balun. Modeled as an ideal transformer in a microwave simulator (ADS), this wide band operation is not observed due to the absence of the transmission-line construction.

The circuit 50 illustrates a Marchand balun application of the planar transformer for achieving a broader and high pass bandwidth using the same construction as the circuit 20 of FIG. 2. With the circuit 50, the terminal which is conventionally grounded is now opened. Because of the transmission line properties of the microstrip coils, the circuit 50 produces a multi-octave high-pass frequency response and operates as a Marchand balun. The circuit 50 can be applied to a monolithically integrated microwave circuit (MMIC) for implementing an inexpensive microwave mixer. The circuit 50 provides bandwidth comparable to conventional coupled line Marchand MMIC mixers, while being implemented smaller and more affordably due to the compact nature of the planar balun structure. Such an implementation is discussed in the articles (i) Steve Maas, et al., 1996 MMMCS, pp. 51, (ii) S. A. Maas, et al., 1993 MMMCS, pp. 53, 2.4×2.4 mm2, and (iii) Y. Ryu, et al. 1995 MMWMCS, which are each incorporated by reference in their entirety. As in the conventional grounded balun configuration, lowering the impedance of the center tap improves the balanced performance over a wider frequency of operation. The improvement in balanced operation in an open configuration is more dramatic than in the conventionally grounded transformer configuration 30.

Referring to FIG. 6, an EM simulations of an "Open" Planar Transformer Amplitude and Phase balance is shown. The open planar balun obtains multi-octave bandwidth. Furthermore, the impedance of the center tap has a similar effect as a conventional grounded transformer. In particular, the transformer becomes more unbalanced as Ztap increases.

FIG. 6 illustrates the amplitude and complementary phase balance of the open planar transformer for a center tap impedance of 10 ohms and 50 ohms. For the 10 ohm Ztap case, amplitude and complementary phase balance illustrated in FIGS. 6a and 6b are maintained over a 6–20 GHz multi-octave frequency band. FIGS. 6c and 6d illustrate the 50 ohm Ztap case. The improvement in balun performance is more dramatic for this planar spiral Marchand (open) configuration than for the conventional grounded transformer case of FIG. 4.

Referring to FIG. 7, a circuit 70 illustrating a conventional transformer balanced Schottky mixer is shown. Optimal wideband planar Marchand transformer and consequently overall mixer performance can be obtained by integrating a low impedance actively matched IF buffer amplifier at the IF center tap of the RF transformer balun. The circuit 70 illustrates a conceptual schematic of a typical transformer balanced Schottky mixer where the RF transformer has an IF center tap. In order to optimize the RF planar transformer balun and overall mixer performance, a low impedance actively matched IF buffer amplifier can be applied to the IF center tap of the RF transformer balun.

It would be desirable to implement loading of a center tap with an optimal finite impedance, such as an active impedance that is electronically tunable. It would also be desirable to implement a MMIC mixer with the RF performance of a Marchand balanced approach, but with the wide bandwidth, gain, and compact size of an active approach. It would further be desirable to provide a broadband low impedance to the center-tap of the transformer balun for optimal broadband balun performance.

SUMMARY OF THE INVENTION

The present invention concerns an apparatus comprising an amplifier circuit, a tuning circuit and a mixer circuit. The amplifier circuit may be configured to generate an output signal at a first node in response to an input signal received through a second node. A tuning circuit may be (i) coupled between said second node of the amplifier circuit and third node and (ii) configured to adjust an impedance presented to the third node in response to a tuning voltage. A mixer circuit may have a center tap coupled to the third node.

In one example, the present invention concerns a planar transformer mixer primary radio frequency (RF) and local oscillator (LO) coils in an open configuration instead of grounded to emulate the wide band operation of a Marchand balun. Additionally, an IF center tap of the RF balun may be actively matched to a low broadband impedance using a directly coupled common-base intermediate frequency (IF) impedance matching amplifier stage. The amplifier stage may be electronically tuned to optimize Marchand operation. The actively matched IF center tap provides the wide bandwidth characteristics of the Marchand mixer approach as well as provides gain and a 50 ohm output match.

One aspect of the present invention concerns the implementation of a symmetrical center tap with a planar Marchand balun. Another aspect of the present invention concerns the low impedance active match of the center-tap of the Marchand planar balun using a common-base IF matching stage. Yet another aspect of the present invention concerns an actively matched IF amp that may be tunable and may be directly coupled to the IF tap port.

The objects, features and advantages of the present invention include providing an actively matched IF amplifier that may (i) present a wide band low real impedance to the IF center tap port of the RF transformer balun, (ii) provide the impedance bandwidth encompassing overlapping IF, LO and RF frequency bands, (iii) provide a low pass gain response, narrower than the impedance bandwidth, to isolate the IF port from the passage of RF and LO signals while providing a wider multi-octave band impedance match, (iv) be integrated monolithically, (v) be directly coupled without compromising diode bias and mixer operation, (vi) implement tuning to adjust the broadband impedance to optimize RF balun and overall mixer performance, and/or (vii) obtain high third order intercept (IP3) performance.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention may be useful, for example, in both military and commercial communication systems in the 2–20 GHz frequency range. The present invention may provide general purpose implementation for wide band operation that may address a multitude of applications such as very small aperture terminal (VSAT) (14 GHz), wireless local area network (WLAN) (6 GHz), electronic warfare (EW) (6–18 GHz), satellite down links (20 GHz), local multipoint distribution system (LMDS), and military applications (e.g., baseband-20 GHz smart antenna arrays for aircraft carriers). The present invention may provide a wide-band microwave mixer by allowing the integration of planar transformers and an actively matched IF center tap buffer amplifier. The mixer topology may have applicability to several semiconductor technologies including Silicon Germanium (SiGe), CMOS SOI, Gallium Arsenide (GaAs), and Indium Phosphide (InP). The present invention extends the state-of-the-art MMIC RF mixer performance by improving the performance to cost ratio of the incumbent Marchand MMIC mixer by over a factor of 2.

The present invention employs a planar transformer configuration that comprises opening the traditionally grounded port of both RF and local oscillator (LO) planar transformers. Such a configuration emulates the planar coupled line Marchand balun structure and results in RF and LO bandwidths that independently span multiple octaves. The structure of the present invention may allow the wide bandwidth characteristics of the coupled line Marchand balun while consuming significantly less die area when the IF center tap impedance is optimized.

Multi-octave balanced operation is obtained through the use of a tunable, low impedance, directly coupled IF buffer amplifier. The present invention may enhance the bandwidth (BW) performance of the traditionally grounded transformer approach as well as the open Marchand transformer configuration. The present invention may provide a conversion gain, 50 ohm output match and RF/LO isolation.

The present invention addresses the asymmetric center tap problem of Rabjohn (discussed in the background section) by integrating two essentially identical interwound transformers similar to Rabjohn side by side and taking the geometrically symmetric center tap point. Such a configuration solves the physically ambiguous tap point of Rabjohn without relying on the symmetric interwound cross-over layout of Rabjohn.

Figure 8:
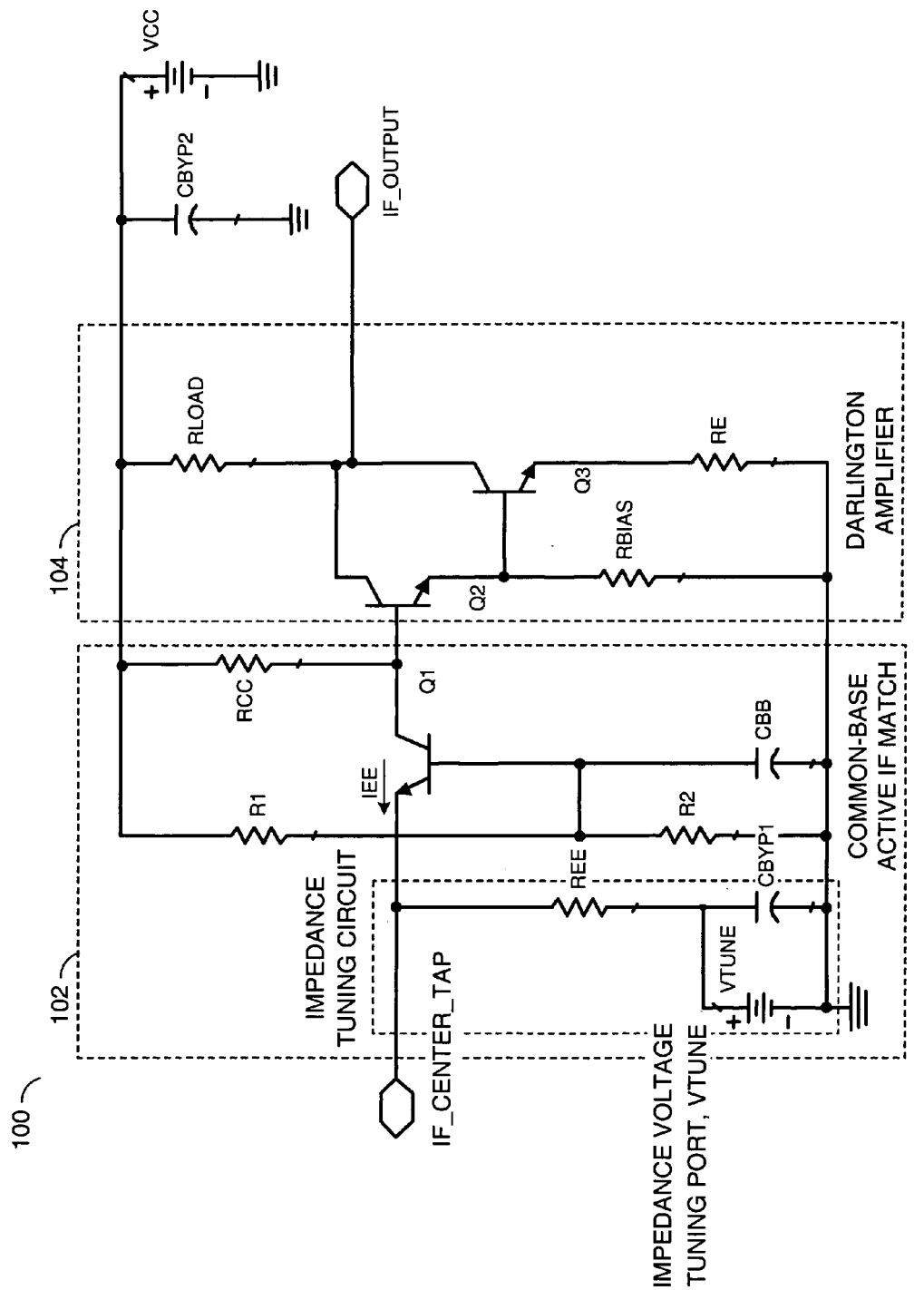
FIG. 8 is a diagram illustrating the common-base amplifier of the preferred embodiment of the present mixer invention.

Referring to FIG. 8, a preferred embodiment of a circuit 100 illustrating an actively matched IF amplifier in accordance with a preferred embodiment of the present invention is shown. The circuit 100 may be implemented as a CB-Darlington IF amplifier. The circuit 100 generally comprises a first stage 102 and a second stage 104. The first stage may be implemented as a common-base impedance transforming stage coupled to a signal (e.g., IF_CENTER_TAP). The signal IF_CENTER_TAP may be directly coupled to an IF center tap of a RF transformer (shown in detail in FIG. 13). As such, the IF center tap of the RF transformer does not need to be grounded as in conventional approaches. The circuit 100 may provide a small (e.g., much less than 50 $\Omega$, preferably 0.1 $\Omega$ to 10 $\Omega$) real impedance to approximate Marchand balun operation. The first stage 102 may be implemented as a common-base stage. The second stage 104 may be implemented as a Darlington amplifier stage.

The common-base stage 102 generally comprises a transistor Q1, a load resistor RCC, an emitter bias resistor REE, an AC Base bypass capacitor CBB, a bias resistor R1, and a bias resistor R2. A low common-base input impedance is generally maintained over a wide multi-octave bandwidth. The impedance, which is predominately real, may be adjusted for optimum balun and overall mixer bandwidth performance by adjusting a tuning voltage (e.g., VTUNE). The tuning voltage VTUNE may be filtered by a bypass capacitor (e.g., CBYP1). The bypass capacitor CBYP1 and the tuning voltage VTUNE may improve the 2—2 spur suppression performance. The common-base stage 102 may also transform the low input impedance of the signal IF_CENTER_TAP to a higher impedance for driving the common-emitter Darlington stage 104.

The Darlington stage 104 may be used to provide good drive (e.g., 18–20 dBm of 1 dB compression) and high linearity performance. The Darlington stage 104 generally comprises a Darlington transistor pair (e.g., a transistor Q2 and a transistor Q3), a bias resistor RBIAS, an emitter feedback resistor RE, and a load resistor RLOAD. The load resistor RLOAD may set the gain and output impedance of a signal (e.g., IF_OUTPUT) presented by the circuit 100. The Darlington output stage 104 may be tailored for high third order intercept (IP3) or linearity performance by resizing the transistors Q2 and Q3 to accommodate larger bias currents.

Figure 9:
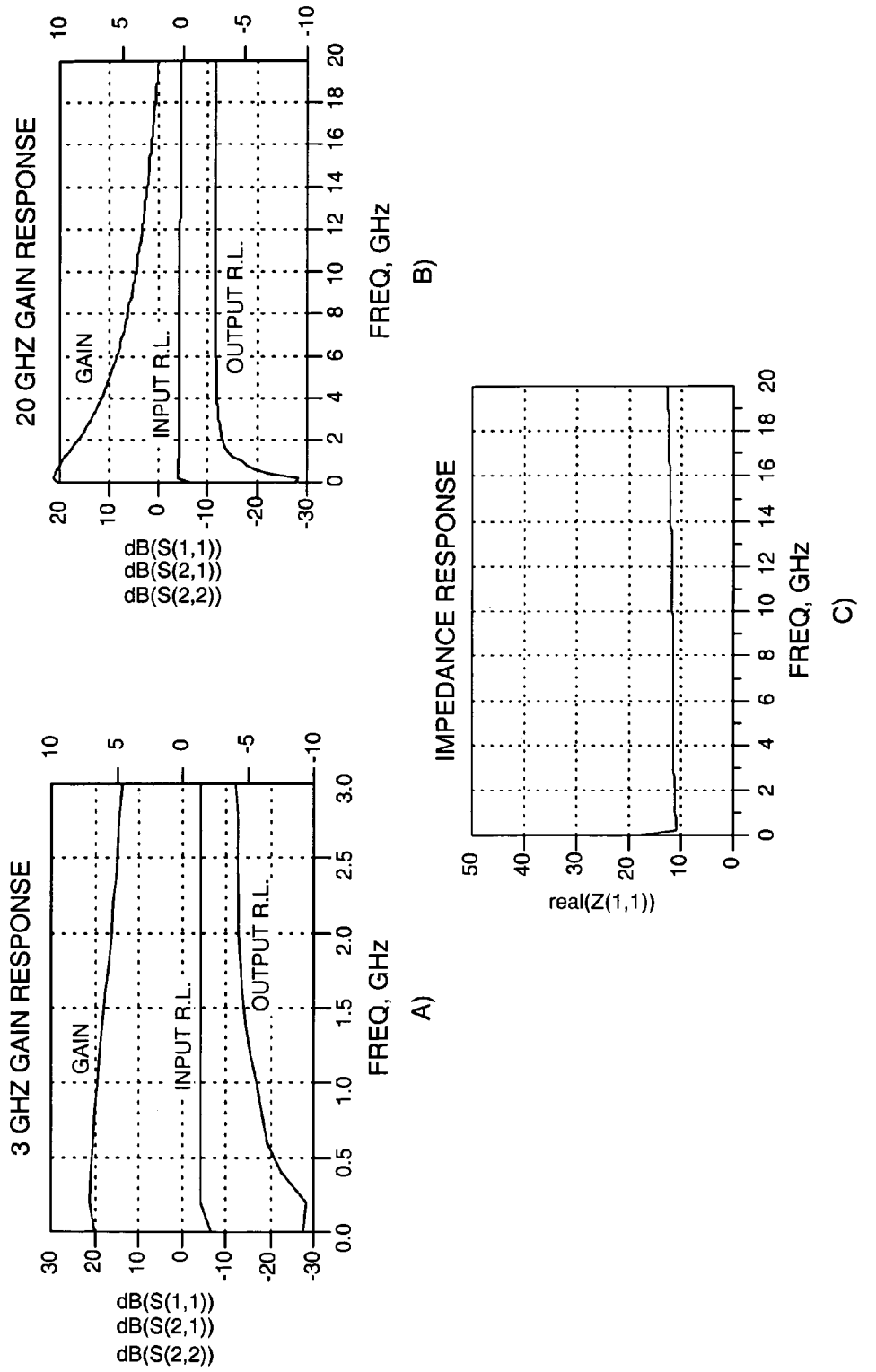
FIGS. 9a–c illustrate CB-Darlington IF Amplifier wide band gain and impedance response of the circuit of FIG. 8.

Referring to FIGS. 9a–9c, simulations of the wide band gain and impedance response of the CB-Darlington IF amplifier 104 is shown. FIGS. 9a–c illustrate the simulated gain and impedance response of the preferred embodiment of the CB-Darlington IF amplifier. FIG. 9a illustrates a 3 Ghz response illustrating the gain and return-loss in the frequency of interest. FIG. 9b illustrates a 20 GHz wideband response illustrating the low-pass gain response which helps isolate the RF frequencies while passing the desired IF frequencies. Greater isolation may be achieved by shunting the resistor output load with a capacitor. FIG. 9c illustrates the wide band input impedance response which needs to maintain a constant real input impedance over essentially the entire RF and LO band in addition to the IF band. A flat 10–12 ohms of real impedance is shown.

Figure 10:
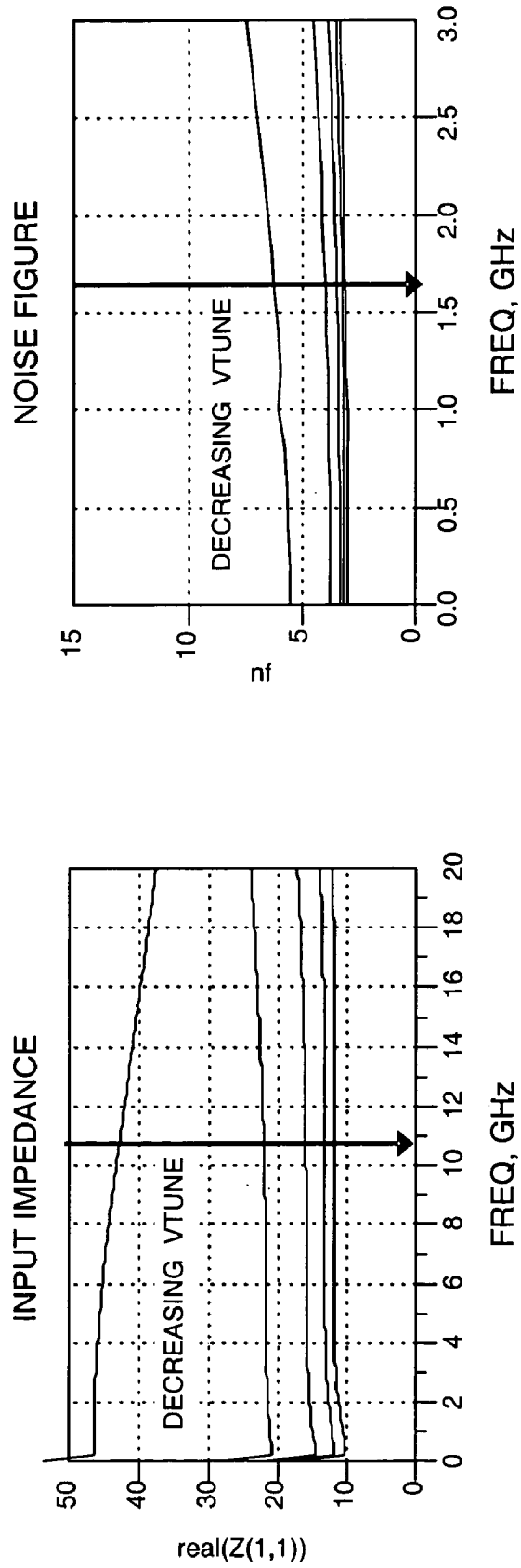
FIG. 10 is a diagram illustrating broadband tunable input impedance and an associated noise figure.

Referring to FIG. 10, a broadband Tunable Input Impedance and associated noise figure of the CB-Darlington IF amplifier 100 is shown. The input impedance maintains a wide band response over the impedance tuning range. The active matched IF amplifier 100 provides broadband input impedance tuning in order to optimize the balun and overall mixer performance. When the voltage VTUNE is decreased (e.g., more negative voltage), the input impedance is decreased. However, the bandwidth does not significantly change. Decreasing the voltage VTUNE also improves the noise figure of the amplifier 100. The noise improvement occurs in spite of the increased shot noise due to the current IEE. Transimpedance Amplifier noise theory teaches that the input referred base and collector shot noise are the dominant noise contributors for high impedance sources. RF noise theory teaches that the noise figure is determined more by the thermal noise of the device (e.g., from Rb and the resistor RE) which are in series with the input. FIG. 10 illustrates that the thermal noise due to 1/gm (where gm is a transconductance gain, or current out over voltage in) that determines the noise figure performance of the common base amplifier 100 of the present invention. Noise decreases as transconductance gain (gm) (i.e., the current output over the voltage input) increases, which consequently decreases the input impedance of the common-base device.

Figure 1:
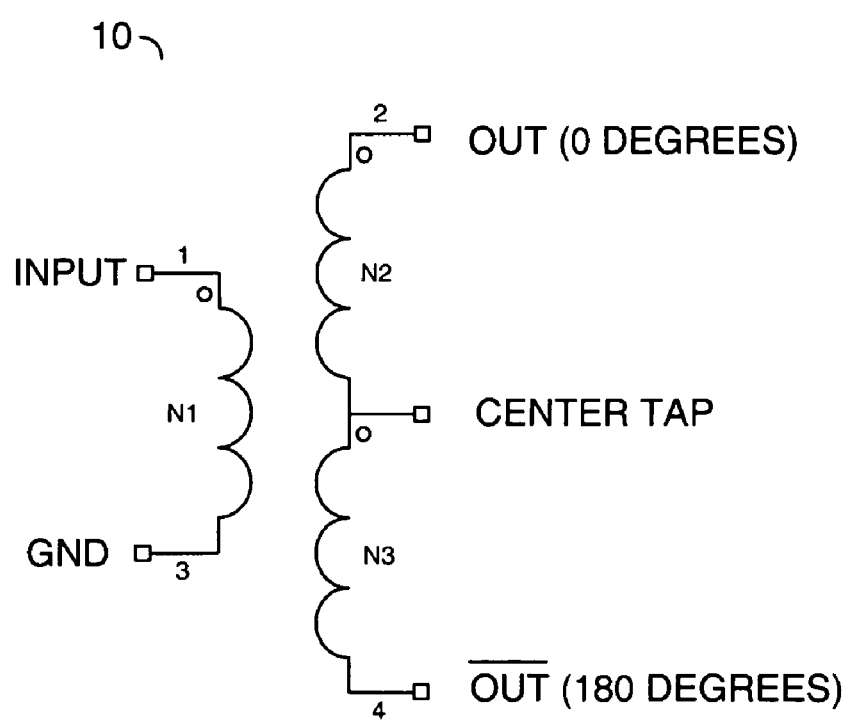
FIG. 1 is a diagram illustrating a conventional balun implementation.
Figure 2:
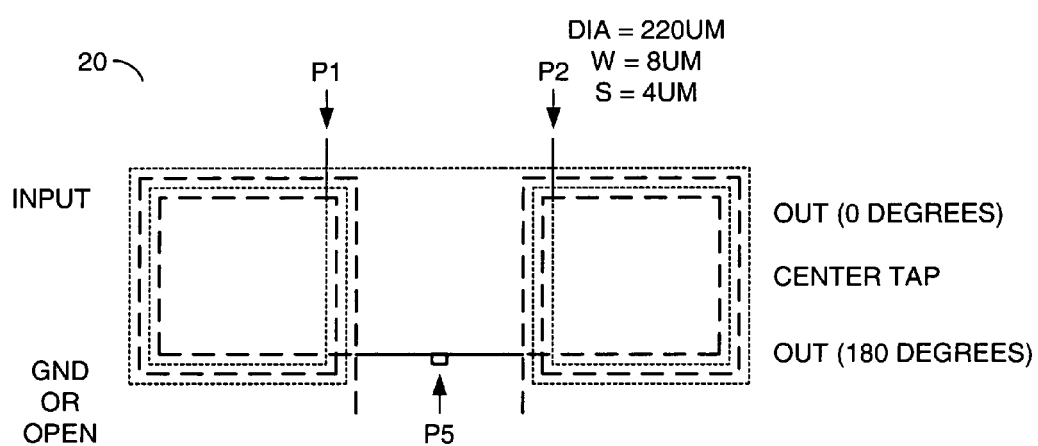
FIG. 2 is a diagram illustrating a conventional planar transformer balun.
Figure 3:
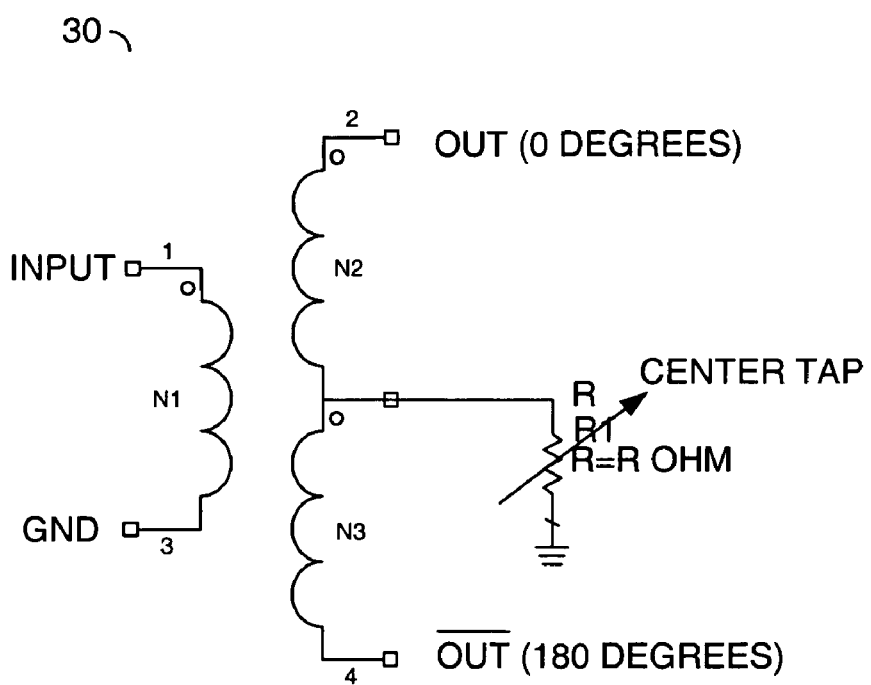
FIG. 3 is a diagram illustrating a conventional center tap transformer.
Figure 4:
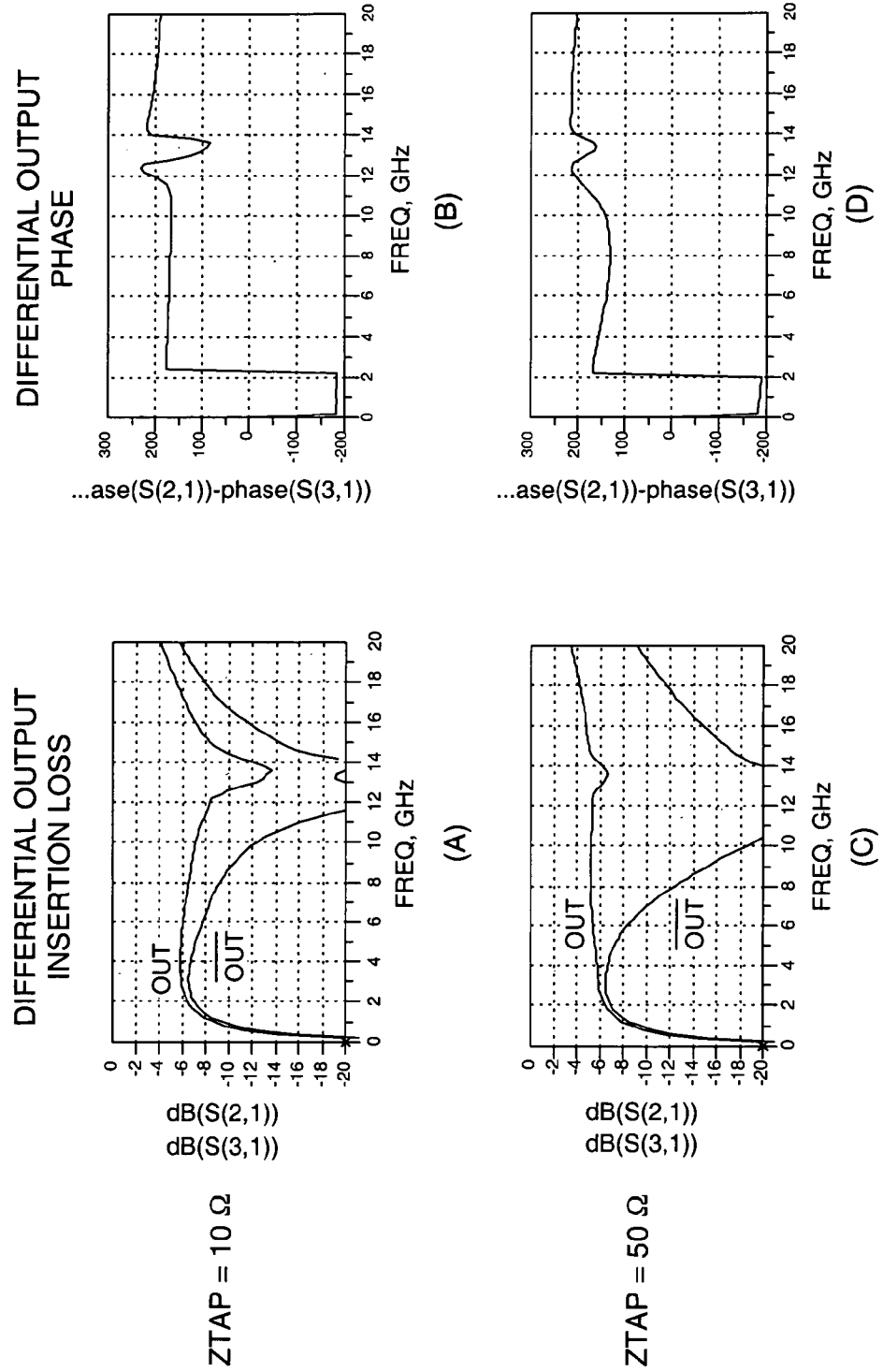
FIGS. 4a–d is a diagram illustrating electromagnetic (EM) simulations of short planar transformer amplitude and phase balance.
Figure 5:
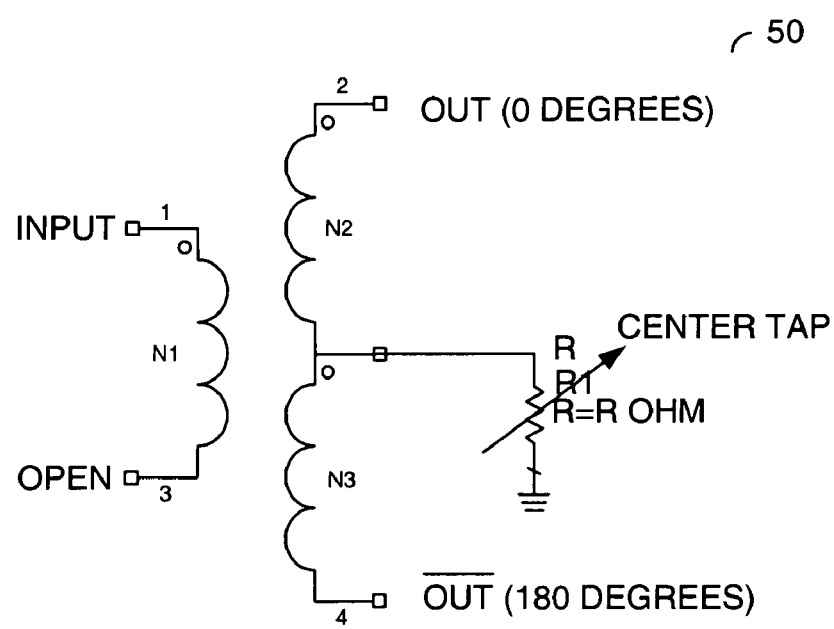
FIG. 5 is a diagram illustrating a conventional planar transformer open configuration.
Figure 11:
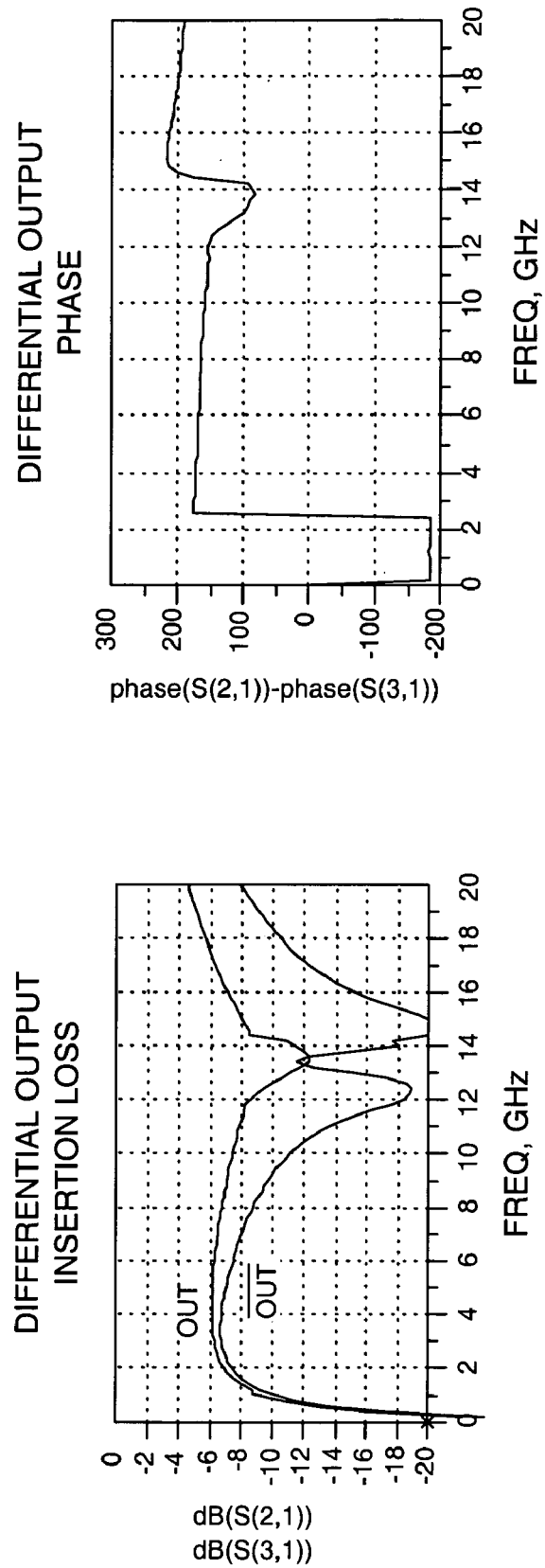
FIG. 11 is a diagram illustrating EM simulations of short planar transformer amplitude and phase balance with the low impedance actively matched IF amplifier.

Referring to FIG. 11, EM simulations of "Short" Planar transformer amplitude and phase balance with low impedance actively matched IF amplifier is shown. The active matched IF amplifier enables the same balanced response as a passive resistor termination of the same impedance. FIG. 11, shows the transformer balanced response when the low impedance actively matched IF amplifier 100 is directly coupled to the IF center tap port of the "short" RF transformer balun. The input impedance is nominally 10 ohms and generally results in the same response as the passive 10 ohm resistive load shown in FIGS. 4a and 4b.

Figure 6:
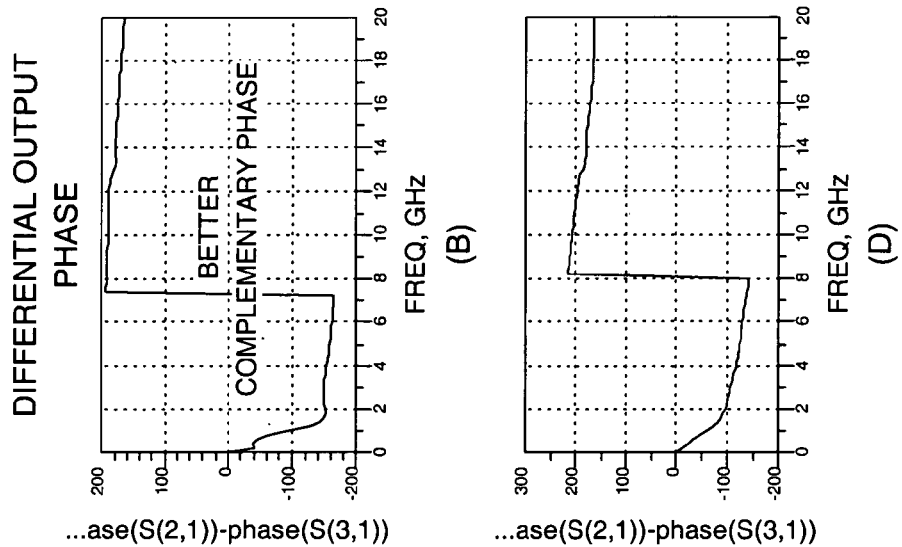
FIGS. 6a–d is a diagram illustrating EM simulations of an open planar transformer amplitude and phase balance.
Figure 6:
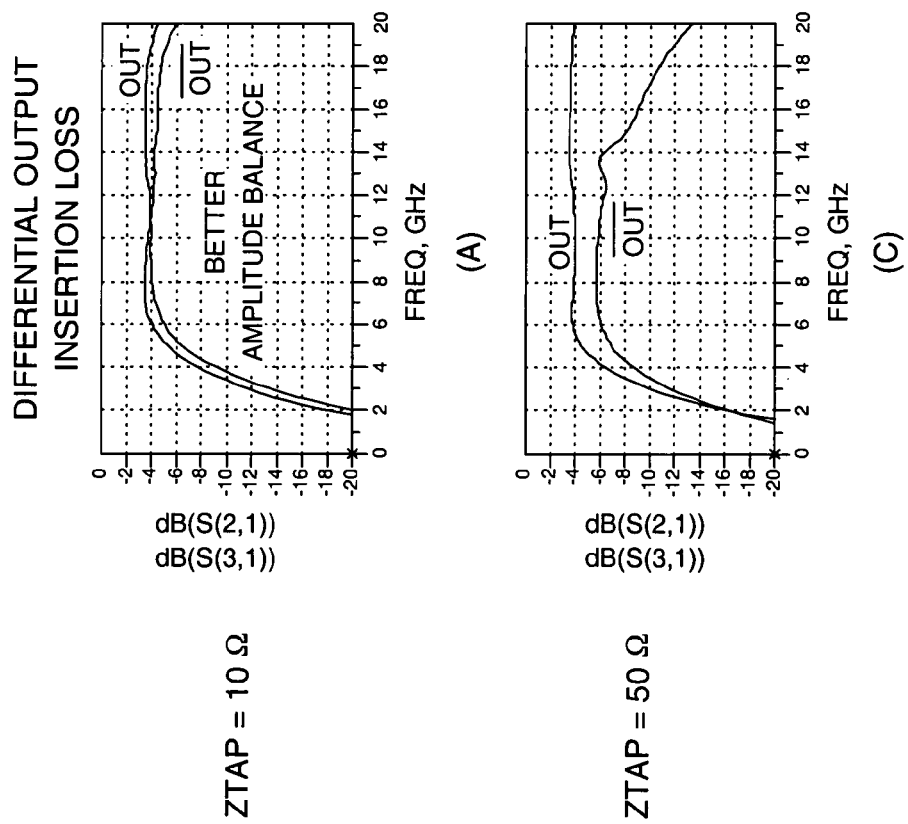
Figure 7:
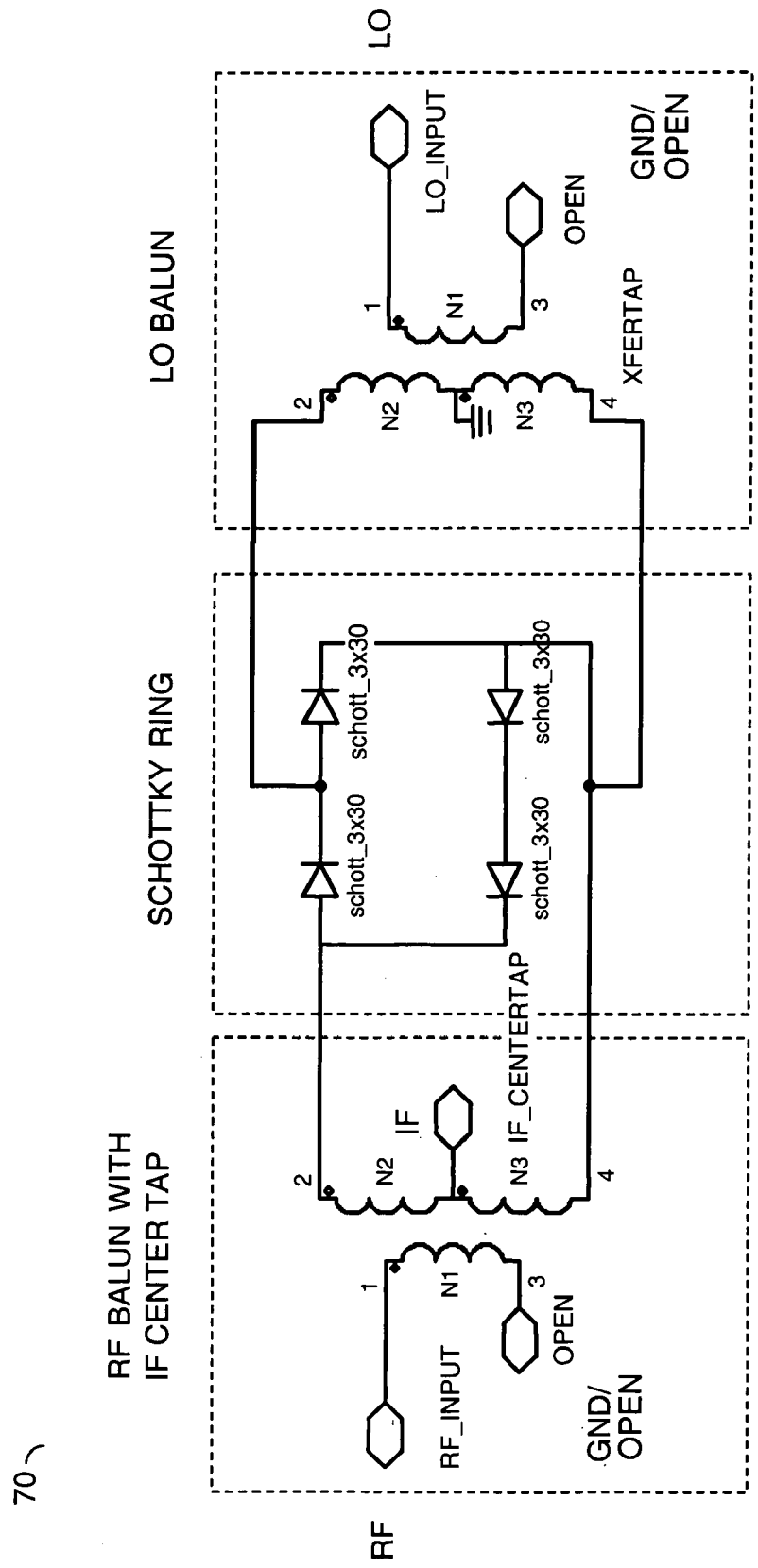
FIG. 7 is a diagram illustrating a conventional transformer balanced Schottky mixer.
Figure 12:
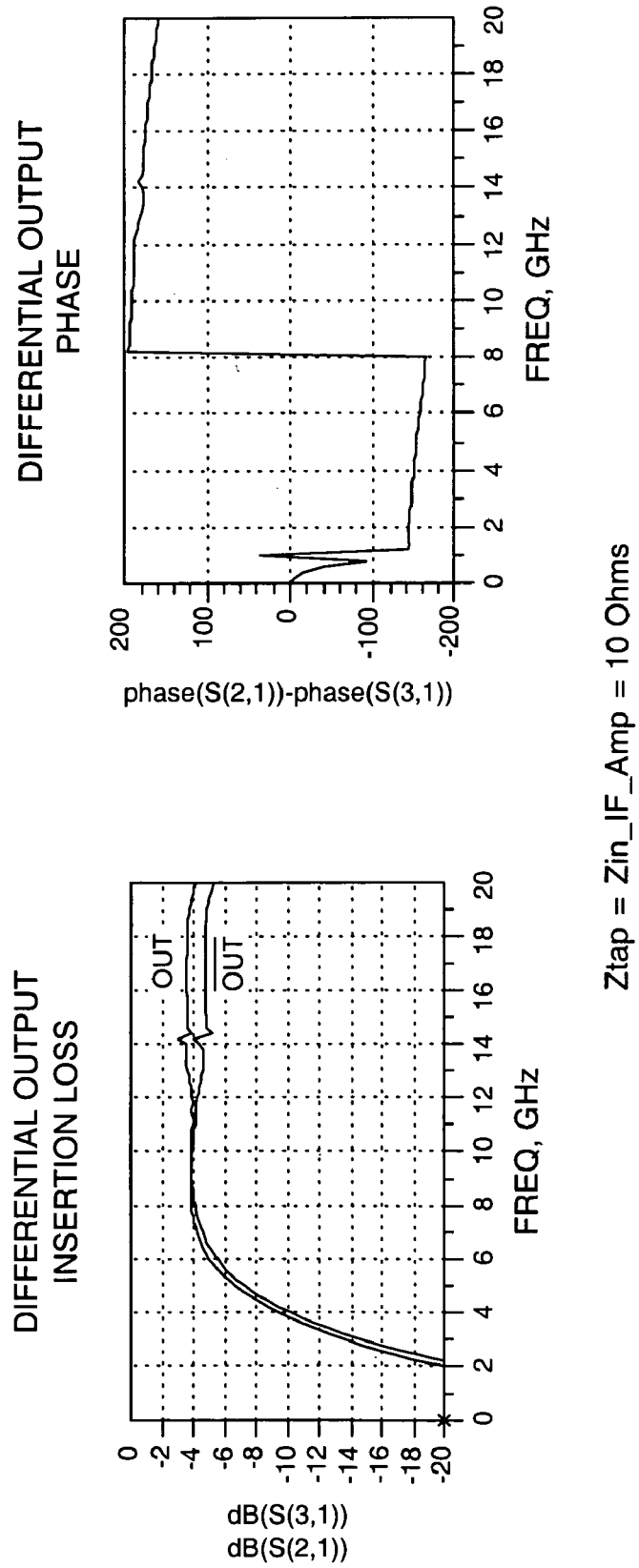
FIG. 12 is a diagram illustrating EM simulations of open planar transformer amplitude and phase balance with the low impedance actively matched IF amplifier.

Referring to FIG. 12, electromagnetic (EM) simulations of "Open" Planar transformer amplitude and phase balance with low impedance actively matched IF amplifier 100 is shown. The active matched IF amplifier 100 enables the same balanced response as a passive resistor termination of the same impedance. FIG. 12 shows the transformer balanced response when the low impedance actively matched IF amplifier 100 is directly coupled to the IF center tap port of the "Open" RF transformer balun. The input impedance is nominally 10 ohms and generally results in the same response as the passive 10 ohm resistive load response shown in FIGS. 6a and 6b.

Figure 13:
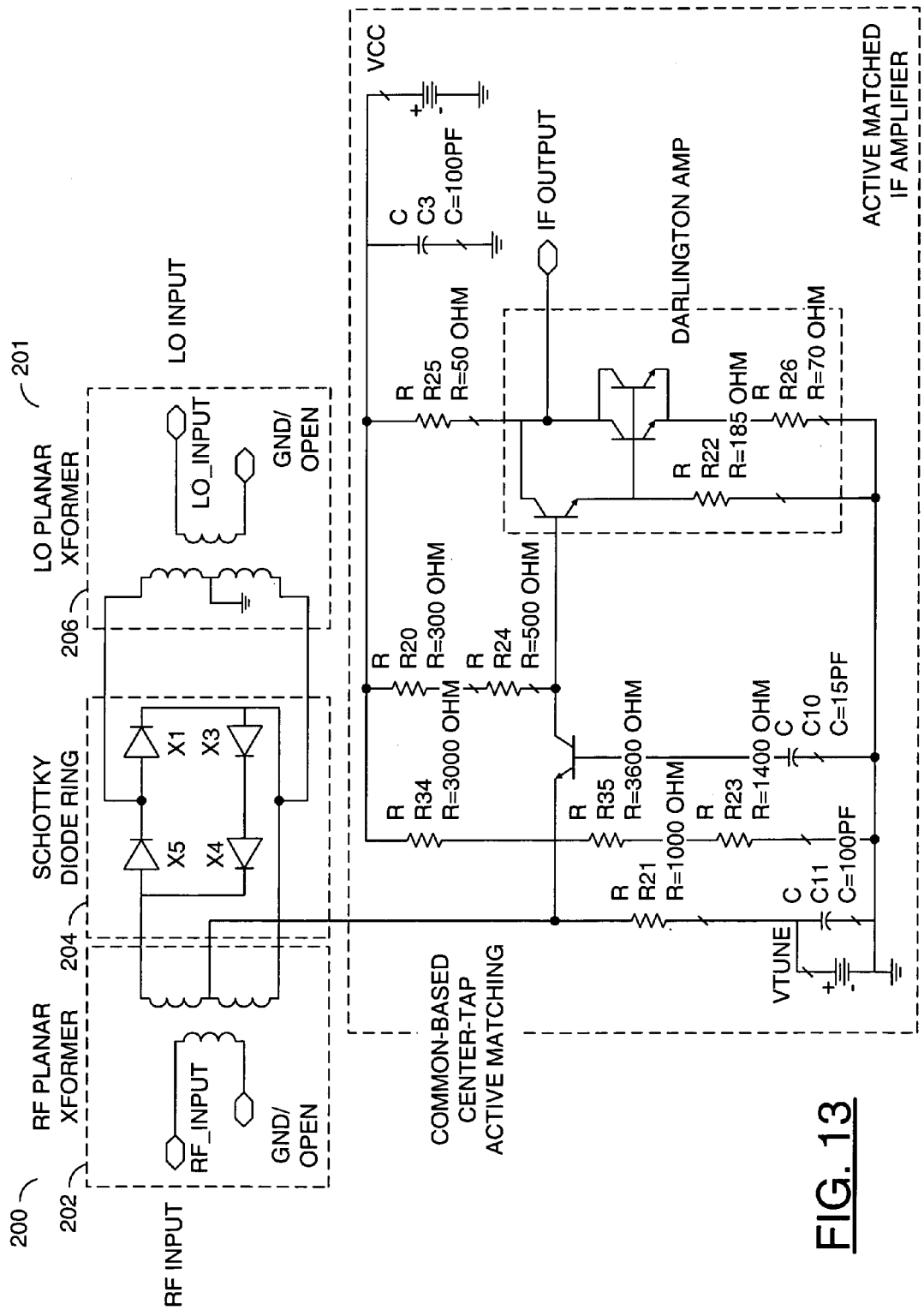
FIG. 13 is a diagram illustrating an embodiment implementing both ground or open configurations benefitting from the actively matched IF amplifier.

Referring to FIG. 13, a system 200 illustrating a context of the invention is shown. The system 200 generally comprises the circuit 100 and a mixer 201. The circuit 100 and the mixer 201 may be monolithically fabricated as a single integrated circuit (IC). Monolithic integration may avoid degradation due to off-chip integration parasitics. In a down conversion mixer application a low impedance common-base buffer between the IF center tap and the IF buffer amplifier may be provided. The mixer 201 may be implemented as a passive balanced Schottky mixer. The mixer 201 generally comprises a first stage 202, a second stage 204 and a third stage 206. The first stage 202 generally comprises a planar transformer stage. The second stage 204 generally comprises a Schottky diode ring. The third stage 206 generally comprises a LO planar transformer stage. Both GND or OPEN configurations benefit from the actively matched IF amplifier. The passive transformer balanced Schottky mixer 201 integrates the RF planar transformer 202 and the LO planar transformer 206 as spiral transformers in either a grounded or an open configuration. The actively matched IF amplifier 100 may be directly cascaded to an IF center tap port 210 of the RF balun.

Figure 14:
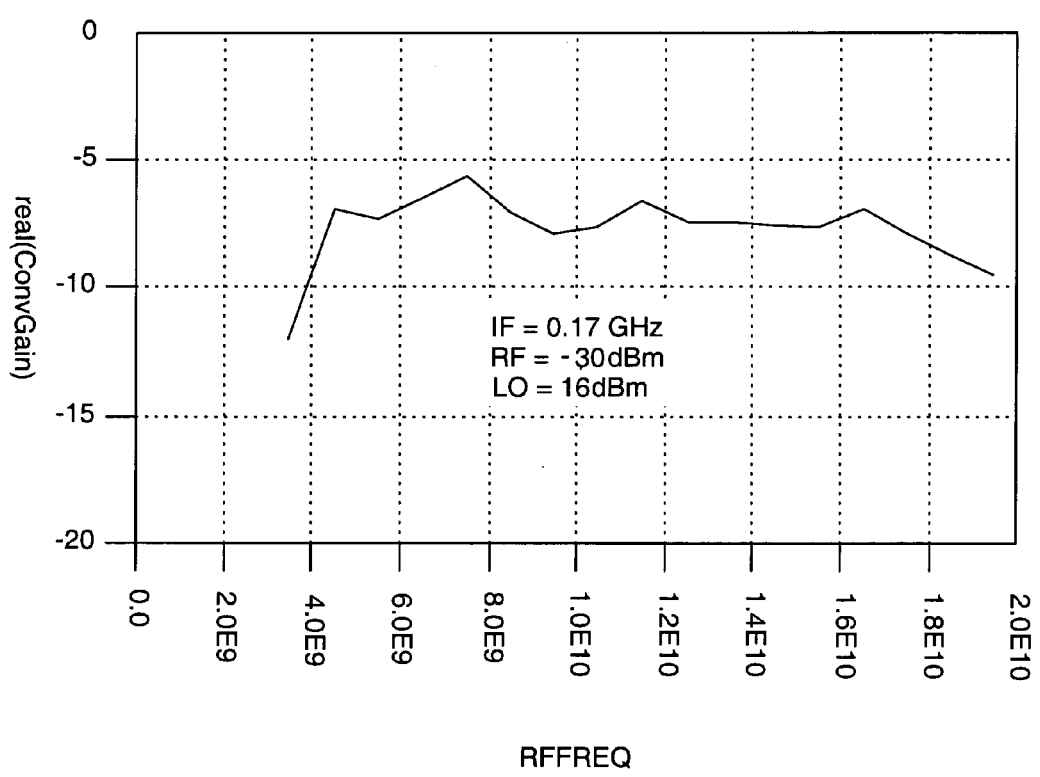
FIG. 14 is a diagram illustrating a simulation of an open planar balun transformer mixer.

FIG. 14 illustrates the mixer response of the planar transformer balanced Schottky mixer of FIG. 13. A three octave-band conversion loss response is achieved from the open planar configuration. The ripple in the passband is due to EM numerical noise. The RF and LO baluns are shown simulated in an open configuration. The IF center tap output is simulated directly driving a 50 ohm load (e.g., without the active matched IF amplifier 100). The illustrated response is for a fixed IF frequency of 170 MHz and RF and LO (=RF−IF) ports simultaneously swept to demonstrate the wideband performance of both RF and LO transformer balun ports. A fairly flat conversion gain of −7.5 dB is achieved over a 4.5–17 GHz +3-octave bandwidth. The RF power is −30 dBm and the LO power is 16 dBm. The simulation illustrates the wide bandwidth capability of the open RF transformer configuration.

Figure 15:
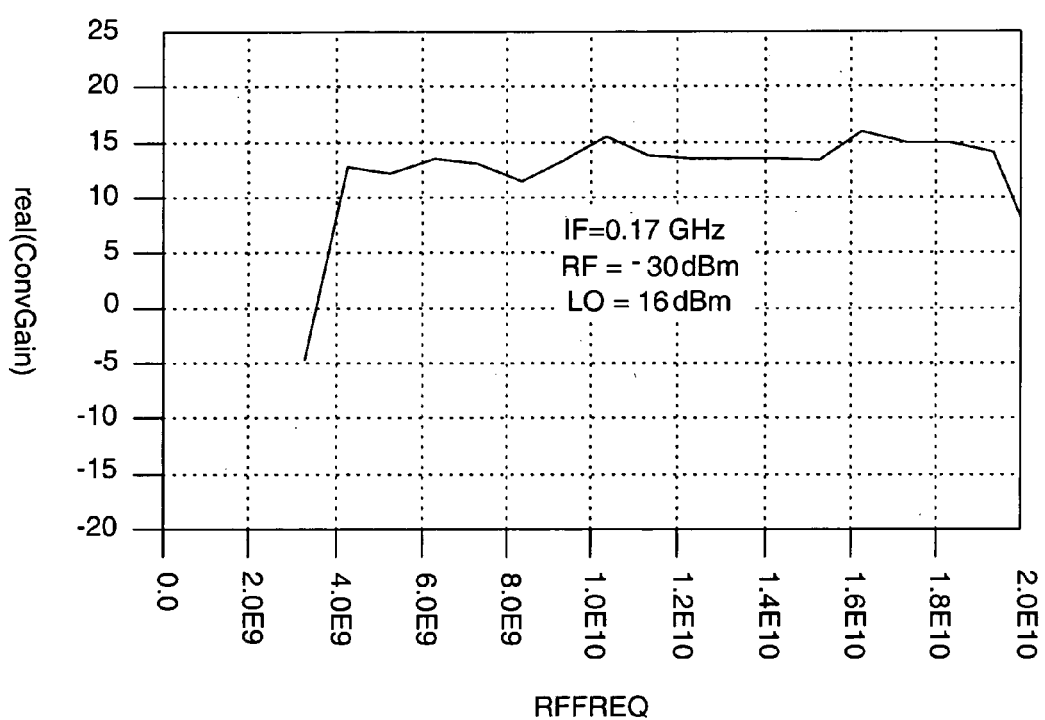
FIG. 15 is a diagram illustrating a simulation of an open planar balun transformer mixer an with the actively matched IF amplifier.

Referring to FIG. 15, a Simulation of "Open" Planar Balun transformer Mixer with Actively Matched IF Amplifier is shown. A five octave-band conversion gain response is achieved from the open planar configuration. The low impedance actively matched IF amplifier is enabled, illustrating the improvement in bandwidth due to the introduction of a low impedance at the IF center tap port of the RF balun. A greater improvement should be observed in the broadband IP2 and isolation characteristics.

FIG. 15 illustrates the mixer response of the planar transformer balanced Schottky mixer of FIG. 13. The RF and LO balun are simulated in an open configuration. The IF center tap is directly coupled to the actively matched IF amplifier. The illustrated response is for a fixed IF frequency of 170 MHz and RF and LO (=RF−IF) ports simultaneously swept to demonstrate the wideband performance of both RF and LO transformer balun ports. A fairly flat conversion gain of ~12 dB is achieved over a slightly wider 4.2–19.5 GHz +4-octave bandwidth. The RF power is −30 dBm and the LO power is 16 dBm. FIG. 15 illustrates the wide bandwidth capability of the open RF transformer configuration combined with the Actively matched IF amplifier 100.

Figure 16:
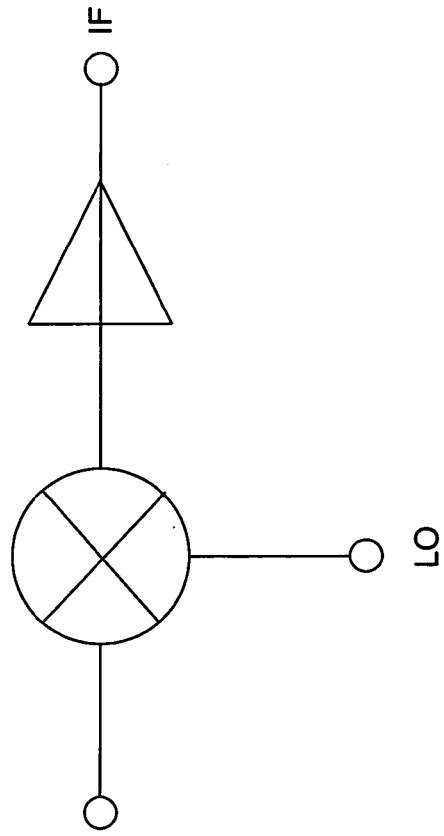
FIG. 16 is a diagram illustrating conceptual gain budget of mixer and the IF amplifier.

Referring to FIG. 16 a conceptual Gain Budget of a mixer and intermediate frequency amplifier (IFA) is shown. The overall IP3 is dependent on gain and IP3 budget through the link. This budget gives an estimate of the performance of the combined Mixer and IF amplifier 100. Improvement in linearity may be achieved by increasing the periphery of the IF amplifier while lowering the gain of the amplifier 100, and increasing the IP3 of the mixer 200 by driving the mixer harder. Employing more linear switch elements such as low parasitic insulated FETs may also improve linearity. The active match IF amplifier 100 may be used as a down converter. For a receiver, a low noise amplifier (LNA) and image reject mixer would precede the RF port of the mixer 200.

The conceptual gain budget can give an idea of how overall output third order intercept (OIP3) and/or input third order intercept (IIP3) is affected by the performance of the individual mixer 200 and IF amplifier 100. For best input IP3, a low IFA gain and high IFA IP3 is desirable. Higher Mixer OIP3 will directly impact the input IP3 for a fixed conversion loss. For broadband microwave MMIC performance, the OIP3 of the mixer 200 is typically 10–18 dBm across a broad band. For narrow-band mixers, the OIP3 of the mixer 200 can be as high as 25 dBm.

The present invention may be implemented in a number of applications. For example, an upconverter application may be implemented. The actively matched IF amplifier can be applied as an un-converter as well, by turning the Darlington stage around so that the output of the Darlington is directly fed into the base of a common-collector amplifier. In this instance the base bias resistors R1 and R2, the base bypass capacitor CBYP1, and the load resistor RCC are all removed. The collector of the transistor Q1 may be directly tied to VCC. In this instance the impedance presented to the IF center tap 210 is essentially the same, and the amplifier 100 now operates as a common-collector amplifier.

In another example, a positive supply application may be implemented. In order to eliminate the negative supply, essentially identical IF amplifiers 100 may be directly coupled to both RF and LO transformer center taps. In such an implementation, the DC bias for the diode ring maintains zero bias across each diode similar to the conventional biasing of a passive Schottky mixer.

In another example, a Higher IP3 application may be implemented. Gain and IP3 of the IF amplifier 100 may be tailored for a specific application by scaling bias current and transistor size.

The present invention may be implemented as a multi-octave monolithic microwave integrated circuit (MMIC) mixer that may provide a low cost mixer solution for broadband instrumentation. The present invention may be useful in communication systems operating at frequencies as high as 30 GHz. Additional applications may include (i) baseband-20 GHz reconfigurable antennas for military applications, (ii) broadband test equipment such as frequency agile sources, (iii) low weight, size, DC power satellite down link systems at 20 Ghz, (iv) 10 GHz, 20 GHz, communication systems for aircraft, (v) wideband 6–18 GHz electronic warfare systems, (vi) 14 GHz VSAT, and (vii) 6 GHz WLAN mixer applications.

The transistors described herein may be implemented as bipolar junction transistors (BJTs), heterojunction bipolar transistors (HBTs), double heterojunction bipolar transistors (DHBT) or pseudomorphic high electron mobility transistors (PHEMT). However, other transistors with similar characteristics may be implemented to meet the design criteria of a particular implementation. In particular, the various transistors of the present invention may be implemented using a variety of process technologies. For example, any or all semiconductors, including compound semiconductors, III–V semiconductors, Silicon Germanium (SiGe), Indium Gallium Phosphorous (InGaP), Indium Phosphide (InP), or Gallium Arsenide (GaAs) may be used. However, other process technologies may be implemented to meet the design criteria of a particular implementation.

While the invention has been particularly shown and described with reference to the preferred embodiments thereof, it will be understood by those skilled in the art that various changes in form and details may be made without departing from the spirit and scope of the invention. For example, a second amplifier may be implemented that may be coupled to a center tap of the transformer 206.

What is claimed is:

1. An apparatus comprising:
   an amplifier circuit configured to generate an output signal in response to an input signal;
   a tuning circuit configured to adjust an RF impedance of said amplifier circuit in response to a tuning voltage; and
   a mixer circuit having a first transformer having a center tap coupled to said tuning circuit.

2. The apparatus according to claim 1, wherein said amplifier circuit comprises a Darlington transistor pair.

3. The apparatus according to claim 1, wherein said tuning circuit comprises a common-base amplifier.

4. The apparatus according to claim 1, wherein said mixer circuit comprises:
   a diode section coupled to said first transformer; and
   a second transformer coupled to said diode section.

5. The apparatus according to claim 1, wherein said amplifier circuit provides a broadband frequency response.

6. The apparatus according to claim 1, wherein said amplifier circuit provides a high frequency response.

7. The apparatus according to claim 1, wherein said tuning circuit provides a low impedance.

8. The apparatus according to claim 7, wherein said low impedance comprises a real impedance.

9. The apparatus according to claim 1, wherein said tuning circuit provides a tunable impedance.

10. The apparatus according to claim 4, wherein said first transformer comprises a spiral wound center tap transformer.

11. The apparatus according to claim 1, wherein said amplifier circuit, said tuning circuit and said mixer circuit are implemented on a single integrated circuit (IC).

12. The apparatus according to claim 4, further comprising:
    a second amplifier coupled to a center tap of said second transformer.

13. The apparatus according to claim 2, wherein said Darlington transistor pair drives a common-collector transistor having an emitter coupled to the center tap.

14. The apparatus according to claim 13, wherein said common-collector transistor provides an up conversion operation.

15. An apparatus comprising:
    means for generating an output signal in response to an input signal;
    means for adjusting an RF impedance of said generating means in response to a tuning voltage; and
    means for mixing having a first transformer having a center tap coupled to said impedance.

16. A method for implementing a center-tapped Marchand mixer comprising the steps of:
    (A) generating an output signal in response to an input signal;
    (B) implementing a tuning circuit configured to adjust an RF impedance of step (A) in response to a tuning voltage; and
    implementing a mixer circuit having a first transformer having a center tap coupled to said impedance.

17. The apparatus according to claim 1, wherein said mixer circuit comprises a center tapped Marchand mixer.

18. The apparatus according to claim 15, wherein said means for mixing comprises a center tapped Marchand mixer.

19. The apparatus according to claim 1, wherein said amplifier circuit drives a common-collector transistor having an emitter coupled to the center tap.

20. The apparatus according to claim 1, wherein said tuning circuit is configured to electronically adjust said RF impedance of said amplifier circuit.

* * * * *